(12) United States Patent
Ruppert (10) Patent No.: US 11,180,047 B2
(45) Date of Patent: Nov. 23, 2021

(54) METHOD FOR TESTING A CHARGING PROCESS

(71) Applicant: AUDI AG, Ingolstadt (DE)

(72) Inventor: Daniel Ruppert, Lenting (DE)

(73) Assignee: AUDI AG, Ingolstadt (DE)

( * ) Notice: Subject to any disclaimer, the term of this patent is extended or adjusted under 35 U.S.C. 154(b) by 136 days.

(21) Appl. No.: 16/441,572

(22) Filed: Jun. 14, 2019

(65) Prior Publication Data

US 2020/0023748 A1    Jan. 23, 2020

(30) Foreign Application Priority Data

Jul. 23, 2018   (DE) .......................... 102018212191.5

(51) Int. Cl.
  *B60L 53/66*   (2019.01)
  *G01R 31/00*   (2006.01)
  *B60L 3/12*    (2006.01)

(52) U.S. Cl.
  CPC .............. *B60L 53/665* (2019.02); *B60L 3/12* (2013.01); *G01R 31/006* (2013.01)

(58) Field of Classification Search
  CPC .......... B60L 53/665; B60L 3/12; B60L 53/00; B60L 53/66; B60L 50/50; G01R 31/006; H02J 7/00
  USPC ... 324/207.13–207.15, 200, 86, 167, 207.25, 324/654, 76.75, 76.11, 500, 750.16, 220, 324/765.01, 545, 137, 160, 177, 139, 143, 324/772
  See application file for complete search history.

(56) References Cited

U.S. PATENT DOCUMENTS

| | | | |
|---|---|---|---|
| 2014/0028265 A1* | 1/2014 | Washiro | H02J 7/007 320/136 |
| 2015/0367745 A1* | 12/2015 | Chiu | B60L 58/12 320/162 |
| 2016/0288648 A1 | 10/2016 | Klapper et al. | |
| 2018/0152035 A1* | 5/2018 | Li | H01M 10/482 |

FOREIGN PATENT DOCUMENTS

| | | |
|---|---|---|
| DE | 102010036994 A1 | 2/2011 |
| DE | 112011103231 T5 | 8/2013 |
| DE | 102012214804 A1 | 2/2014 |

(Continued)

OTHER PUBLICATIONS

German Examination Report dated May 21, 2019 in corresponding German Application No. 10 2018 212 191.5; 20 pages.

*Primary Examiner* — Douglas X Rodriguez
*Assistant Examiner* — Trung Q Nguyen
(74) *Attorney, Agent, or Firm* — Maier & Maier, PLLC (57) ABSTRACT

A method for testing a charging process of an electrically powered motor vehicle having an on-board power system, wherein said on-board power system includes at least one charge connection for connecting the on-board power system to a charging station and is connected to at least one electric power storage device, wherein an adapter having at least one discharge connection is additionally connected to the on-board power system for testing the charging process, wherein electric power for testing the charging process is conducted via the at least one charge connection into the on-board power system, wherein a primary portion of said electric power is discharged again from the on-board power system via the at least one discharge connection of the adapter.

20 Claims, 2 Drawing Sheets

(56) References Cited

FOREIGN PATENT DOCUMENTS

| DE | 112013003194 T5 | 3/2015 |
| DE | 102016102825 A1 | 8/2016 |
| DE | 102016102827 A1 | 8/2016 |

\* cited by examiner

METHOD FOR TESTING A CHARGING PROCESS

FIELD

The disclosure relates to a method and system for testing a charging process of an electrically powered vehicle.

BACKGROUND

An electric vehicle comprises a traction battery and therefore typically a high-voltage storage device for storing electric power for driving the electric vehicle. Two options are provided to charge such a high-voltage storage device. According to a first option, AC charging is performed at a conventional alternating voltage and a charging power of 11 kW, for example. According to a second option, DC charging is performed by means of a direct voltage at a charging power of 150 kW, for example. Both charging options require separate protection, testing, and release. But this is a challenge for electric vehicles of battery electric vehicles (BEV) of the latest generation with a range of approx. 500 km, since charging can only be tested on an empty traction battery. After each attempt of fully charging the traction battery, the electric vehicle must be driven until the battery is empty again and the electric energy fed into the traction battery in the charging process must be converted into mechanical energy. At an average range of approx. 500 km, this results in a considerable development effort and thus in a loss of a testing time.

As the only option currently is to drive the electric vehicle to discharge the traction battery, the respective trip must be made by a properly instructed driver who has a prototype driver license. This increases a development effort. In addition, testing times become longer and a number of prototypes increases, which is accompanied by a loss in test time.

A device and method for controlling a removal of power from an external power source into a plug-in vehicle are known from document DE 10 2010 036 994 A1.

A battery management system for a vehicle known from DE 10 2016 102 825 A1 includes a controller for controlling a charge state target value according to an angle of inclination of the vehicle.

Document DE 10 2016 102 827 A1 describes a method for operating a vehicle, wherein a charge state of a traction battery is reduced.

Before this background, it is the problem to effectively test a charging process with electric power of a vehicle configured as a motor vehicle.

SUMMARY

The method is intended for testing or trying out a charging process and/or a charge function of an electrically driven motor vehicle having an electric on-board power system, particularly a high-voltage (HV) on-board power system, wherein the on-board power system comprises at least one electric charge connection, for example at least one charging socket or outlet and/or at least one charging plug for connecting the on-board power system to a typically external and/or stationary charging station, and is connected to at least one electric power storage device of the motor vehicle. An adapter having at least one discharge connection, for example at least one discharge socket or outlet and/or at least one discharge plug is connected to the on-board power system for testing, e.g. before testing, wherein electric power used for testing the charging process from the charging station via the charge connection is conducted, e.g. introduced or fed, to and/or into the on-board power system is discharged or removed again via the discharge connection of the adapter.

Thus electric power which is fed into the at least one electric power storage device in a conventional charging process, as it is typically performed in the operation of a motor vehicle, is removed or discharged again in the method according to the invention for testing the charging process before it is stored in the at least one electric power storage device past the at least one electric power storage device via the discharge connection or the adapter, respectively.

Thus the electric charging process for the motor vehicle can be tested without necessarily having to charge the electric power storage device. According to the invention, electric power is immediately or synchronously discharged or removed or drained from the on-board power system after it was fed into the on-board power system.

In an embodiment, the electric power for testing a charging process is conducted or fed into the on-board power system at a defined rate, particularly a maximum intended rate, particularly a charging power. This rate set or to be set also corresponds to the power at which a conventional or regular charging process into the on-board power system is performed.

It is possible that the electric power is fed into the on-board power system at a set defined rate via a charging station by means of an electric voltage, which has a first high value. A secondary portion of the electric power for testing the charging process and the on-board power system is provided to at least one electrical subscriber or consumer of the motor vehicle via a voltage converted into a second low value and is used for, or consumed by, testing. But the primary portion of the electric power is discharged again. The primary portion is not fed into the electric power storage device and not consumed. Due to an electric resistance of the on-board power system, a portion of the primary portion of electric power originally fed into the on-board power system may be dissipated.

The method can be performed for a motor vehicle which comprises an on-board power system having the at least one charge connection, e.g. the at least one charging plug, and at least one electric converter, e.g. at least one current and/or voltage converter, wherein the adapter is connected to the at least one charging device.

In an embodiment, the on-board power system, particularly its charging device, has in addition to said at least one charge connection as its input at least one intermediate electric connection, e.g. at least one intermediate socket and/or at least one intermediate plug, as its output. Accordingly, the adapter comprises in addition to said at least one discharge connection as its output at least one intermediate electric connection, e.g. at least one intermediate socket and/or at least one intermediate plug, as its input. It is therefore possible to connect the on-board power system, particularly its charging device, and the adapter via their intermediate electric connections as interfaces for the charging process. The intermediate connections of the on-board power system and the adapter are for example configured as intermediate high-voltage connections or as high-voltage taps. In addition, the discharge connection of the adapter may be configured, for example, as a high-voltage discharge connection or high-voltage tap. The discharge connection of the adapter may be configured as a direct voltage socket for a discharging station.

The method can be performed for an on-board power system of a motor vehicle to which, in addition to the at least one electric power storage device, at least one electrical consumer or subscriber, e.g. at least one electric machine and/or at least one electric device. The at least one electric power storage device is configured as a high-voltage storage device and the at least on electrical consumer is configured, for example, as a regular low-voltage consumer, wherein the secondary voltage portion of the power conducted or fed into the on-board power system is supplied to the at least one low-voltage consumer at a voltage which, starting from the first high value, is converted into the second low value, and the remaining primary portion of electric power is discharged from the on-board power system past the at least one electric power storage device via the at least one discharge connection and for example is discharged or removed via the discharge socket as the at least one discharge connection of the adapter and for example supplied to an external and/or stationary discharging station, which has, for example, at least one external electric power storage device and/or to an external consumer. It is also conceivable that at least one high-voltage consumer is directly connected to the on-board power system. For testing the charging process, on the one hand, electric power with a defined charging power is fed into the on-board power system, and a portion of the electric power, at least that portion which in a conventional charging process is fed into the at least one power storage device, is discharged or removed from the on-board power system via the adapter and past the at least one power storage device.

According to the invention, at least one first consumer, which is configured as a common low-voltage consumer, can be supplied with electric power during the charging process. Furthermore, electric power is conducted past at least one second consumer configured as a common high-voltage consumer, wherein the electric power conducted past the at least one second consumer is discharged or drained from the on-board power system via the adapter, i.e. the power flow or charging power can be conducted from the motor vehicle or on-board power system past common high-voltage consumers.

By setting the defined or intended charging power for testing the charging process, conditions which prevail in a real charging process during continuous operation of the motor vehicle can be set, and the on-board power system, i.e. components of the on-board power system, but also consumers or devices connected to the on-board power system in addition to the at least one power storage device can be exposed to real conditions and thus to the resulting real strains that prevail during a charging process. Thus the charging process and the on-board power system can be subjected to strains and reliably tested depending on the charging power set, which typically is the respective required charging power.

In an embodiment, the electric power is supplied to the on-board power system at a maximum possible rate as the defined or definable charging power for testing the charging process and/or a charge function. This rate is for example 150 kW for direct current (DC) charging and for example 11 kW for alternating current (AC) charging. The method can be used to test a communication of electric devices or subscribers in the motor vehicle and a communication between a charging infrastructure and the motor vehicle in the charging process. It is also possible to test a charge indicator, e.g. an LED indicator, of a charge socket and/or the at least one charge connection. Furthermore, the charging process and a charging sequence provided for it can be tested with reference to a standard. This also applies to a timing of the charging process, which can also be tested in accordance with the standard. It is also possible to test various operating parameters, such as a current, a voltage, or a temperature of the on-board power system during the charging process. This also includes, for example, a timing of such an operating parameter. It is also possible to test a locking of a plug and/or a socket. A safety function test can check if at least one operating parameter has a critical value, such that it can be verified if there is e.g. an overcurrent, an overvoltage, or an overtemperature in the charging process. In addition, a service life test can be performed by continuous charging. During a conventional charging process, the electric power drawn from the on-board power system by at least one low-voltage consumer can be returned to the on-board power system. Transfer of electric power from the on-board power system to the at least one low-voltage consumer is automatically ensured by the at least one converter via which the on-board power system and the at least one low-voltage consumer are connected. Furthermore, measuring points for measuring a current and a voltage may be provided on the adapter in order to check if the supplied electric power or a supplied electric charging power is removed from the on-board power system via the adapter or drained from the on-board power system. A defined amount of electric power or a defined charging power can be removed from the motor vehicle, the on-board power system, and the at least one electric power storage device by measuring the current and the voltage.

Furthermore, the method is performed for a motor vehicle having an on-board power system which comprises at least one control device for controlling the operation of the on-board power system, wherein this at least one control device may be configured as the at least one electrical consumer, wherein the secondary portion of electric power is provided to the at least one control device during a charging process for testing the on-board power system. At least the secondary portion of the electric power is conducted and supplied to the control device which is configured as a low-voltage consumer during the charging process, wherein said secondary portion of the electric power which is conducted, e.g. introduced or fed via the charge connection to the on-board power system for testing the charging process is provided to the control device via a voltage converted from the high value to the low value. The primary portion of the power is discharged or removed from the on-board power system past the at least one power storage device via a high-voltage (or HV) tap and via the discharge connection of the adapter.

The at least one electric power storage device and the at least one consumer are connected to the on-board power system and thus coupled thereto. Depending on the definition, the at least one electric power storage device and/or consumer may also be integrated in the on-board power system and configured as a respective component of the on-board power system. Regardless of such definition, the electric power is conducted during the charging process into the on-board power system via the charge connection, at least through some components, e.g. lines, of the on-board power system and/or partially supplied to the at least one consumer, but not supplied to the at least one power storage device, and the portion of the charged power not supplied to the at least one consumer is then discharged from the on-board power system via the adapter and its at least one discharge connection.

Electric power which is conducted or fed into the on-board power system for testing the charging process for the motor vehicle and/or the on-board power system via the at least one charge connection, is either consumed by respective consumers connected to the on-board power system or directly and/or synchronously discharged or removed from the on-board power system via the at least one discharge connection of the adapter and thus conducted through the on-board power system, wherein a defined rate, e.g. charging power, is set.

The system according to the invention is configured for testing or trying out a charging process or a charge function, respectively, of an electrically driven motor vehicle having an on-board power system, particularly a high-voltage (HV) on-board power system, wherein the on-board power system comprises at least one electric charge connection, for example at least one charging socket or outlet for connecting the on-board power system to, for example, an external and/or stationary charging station, and is connected to at least one electric power storage device. The system comprises an adapter with an electric discharge connection, e.g. a discharge socket, which adapter must in addition be connected to the on-board power system prior to the charging process, wherein power which is to be conducted or conducted or to be fed or fed to or into the on-board power system via the at least one charge connection for testing the charging process is to be or can be discharged or is to be or can be removed from the on-board power system past the at least one electric power storage device via the at least one discharge connection of the adapter.

The adapter of the system is configured as a direct current adapter or direct voltage adapter and/or alternating current adapter or alternating voltage adapter and may comprise various plugs and/or sockets as the at least one intermediate connection, typically for high voltage, to the on-board power system and various plugs and/or sockets as the at least one discharge connection, typically for high voltage, to the discharging station, via which the adapter can be connected to different on-board power systems and discharging stations.

In an embodiment, the system comprises the at least one discharging station which is to be or is connected to the at least one discharge connection and is configured to receive electric power which is to be or is conducted through the on-board power system when testing the charging process, such that the electric power is fed into the at least one discharging station instead of an electric power storage device of the motor vehicle.

It is also possible that the at least one charge connection of the on-board power system is configured as a component of the system.

In an embodiment of the system, the adapter with the at least one discharge connection is to be or can be connected to the on-board power system prior to testing the charging process such that the primary portion of the electric power conducted into the on-board power system for testing the charging process is conducted past the at least one power storage device and virtually synchronously discharged from the on-board power system via the at least one discharge connection of the adapter. The adapter preferably is, is to be, or can be coupled to the on-board power system via a high-voltage (or HV) tap. Accordingly, the intermediate connections of the on-board power system and the adapter are configured as intermediate high-voltage connections or as high-voltage taps. In addition, the at least one discharge connection may be configured as a direct current or alternating current discharge connection, preferably as a high-voltage discharge connection. Accordingly, the intermediate connections may be configured as direct current or alternating current intermediate connections, preferably as high-voltage intermediate connections.

The adapter, e.g. a high-voltage adapter of the system is typically configured for testing a high-voltage charging of the electrically powered or driven motor vehicle, e.g. an electric vehicle or a hybrid vehicle, wherein the electric charging process of the motor vehicle using the adapter can be tested, tried out, and/or examined. In an embodiment, said adapter for testing the charging process is connected to, e.g. plugged into, the on-board power system, particularly high-voltage on-board power system, and/or to a component of the motor vehicle configured, for example, as a high-voltage component, wherein at least one socket and/or at least on plug of the adapter is on the one hand plugged into or onto a matching plug and/or a matching socket of the on-board power system, and on the other hand is plugged into or onto a matching plug and/or a matching socket of the discharging station. The adapter may for example also be directly connected to the charging device of the on-board power system.

The adapter, which for example is configured as a high-voltage adapter, provides at least on other output for a positive voltage (HV+) and a negative voltage (HV−), e.g. via a socket and/or a plug, in addition to the existing connection between an output of the charging device and the on-board power system by the at least one discharge connection. A high-voltage (HV) cable via which the electric power is returned from the on-board power system via the adapter to the external discharging station can be connected to the socket as an adapter port during the charging process, regardless of whether an alternating current (AC) charging or direct current (DC) charging is performed.

This method can be used to feed electric power to the charging socket of the on-board power system during charging, wherein a charging power is directly discharged or removed from the on-board power system via the adapter and its discharging socket. As a result, a state of charge (SOC) of the electric power storage device, which is for example configured as a battery or battery pack, is not increased because the storage device is not charged or only negligibly charged. But for the motor vehicle, typically for the at least one control device, e.g. controller, of the motor vehicle, a regular or conventional charging process at the typically intended or required charging power is registered and thus carried out. The adapter of the system may for example have a current-carrying capacity of 350 amps of direct current at a voltage or direct voltage of 500 volts.

When developing the electrically driven motor vehicle, many charging tests or composite charging tests must be performed and multiple charging processes must be tested on the motor vehicle to ensure a complete charging chain. A network infrastructure, a charging cable, a charging socket, a charging device, a cabling, particularly a high-voltage cabling, and the electric power storage device, particularly a high-voltage storage device, must be taken into account in this process. It has been required in the course of such testing that a motor vehicle had to be fully charged multiple times, which results in a considerable extra development effort in view of the increasing number of electrically driven motor vehicles (BEV). In theory, it would be necessary to drive the motor vehicle after each test for multiple hours on a test track until it is discharged, wherein the electric power storage device charged in the charging process is empty again before another charging process can be tested. When using the method according to the invention, electric power supplied to the on-board power system in a test of a charging process can immediately and synchronously be removed again, which saves the effort of emptying the power storage device by driving.

In an embodiment, the system presented comprises a touch-protected adapter as a touch-protected unit, which can be plugged into and thus connected to the on-board power system in the motor vehicle and thus to at least one component of the on-board power system. At least one component can be configured as a high-voltage component of the motor vehicle. The adapter, which is preferably configured as a high-voltage adapter, when coupled to the high-voltage (HV) on-board power system, provides another output, e.g. in the form or a socket, for HV+ and HV− in addition to the existing connection, which is the output of the charging device at the HV on-board power system. In this way, a flow of electric power can be conducted through the motor vehicle and its on-board power system, but past the at least one electric power storage device, particularly high-voltage storage device of the motor vehicle, and additionally past an at least one high-voltage consumer, if required. This means that neither the at least one electric power storage device nor the at least one high-voltage (HV) consumer is supplied with electric power.

In one embodiment of the method utilizing an embodiment of the system, a development effort of the motor vehicle can be reduced because no driver is required for driving the motor vehicle until empty, and the resulting loss of time is avoided. It is therefore possible to shorten test and trial times, since a charging process can be performed fast and with little effort when using the method. The number of prototypes that would otherwise be required is reduced accordingly.

It will be appreciated that the features mentioned above and the features to be explained below cannot just be used in the combination described but in any other combination or by themselves, without deviating from the scope of the present invention.

BRIEF DESCRIPTION OF THE DRAWINGS

The invention is schematically represented in the drawings based on embodiments thereof and will be described schematically and in detail with reference to the drawings.

The figures are described coherently and as a whole, wherein like reference numbers are assigned to like components.

DETAILED DESCRIPTION

Figure 1:
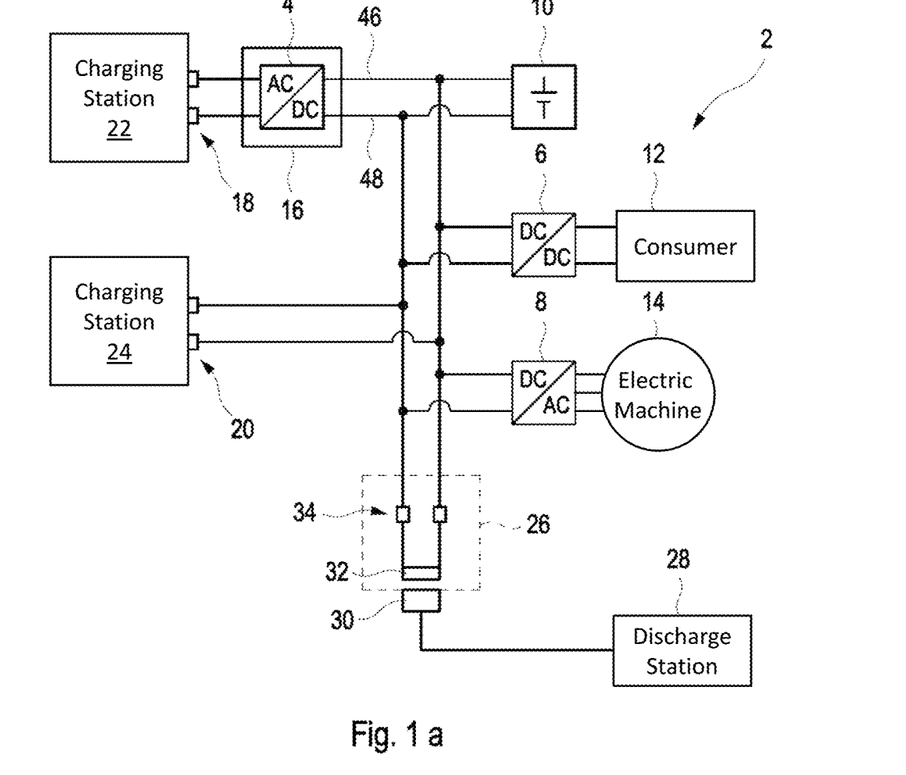
FIGS. 1a and 1b are schematic views of a first embodiment of the system according to the invention for performing a first embodiment of the method according to the invention.

FIG. 1a is a schematic view of an on-board power system 2 of a motor vehicle configured as a hybrid vehicle or electric vehicle, wherein said on-board power system 2 comprises multiple interconnected cables, particularly high-voltage cables, as components. A first strand 46 includes multiple interconnected cables for a positive high voltage (HV+) and a second strand 48 includes multiple interconnected cables for a negative high voltage (HV−). The on-board power system 2 includes as other components a first converter 4, in this case an alternating current/direct current converter, a second converter 6, in this case a direct current/direct current converter, and a third converter 8, which in this case is configured as a direct current/alternating current converter or inverter. An electric power storage device 10 or a respective battery is connected to the on-board power system 2, which storage device is in this case configured as a high-voltage storage device. At least one consumer 12, e.g. an electric device, is connected to the on-board power system 2 via the second converter 6. An electric machine 14 is connected to the on-board power system 2 via the third converter 8. The electric power storage device 10 is a high-voltage storage device, which provides a direct voltage greater than 60 V at its terminal pair. The consumer 12 however is supplied a low voltage with a low value of e.g. 12 V, wherein this voltage is configured as a direct voltage. The high direct current voltage from the on-board power system 2 is converted by the second converter 6 into a low direct current voltage for the consumer 12.

The electric machine 14 is configured as a drive unit for driving the motor vehicle and can either be operated as a motor or as a generator. The third converter 8 converts the high direct current voltage from the on-board power system 2 into high alternating current voltage for the electric machine 14 or converts the high alternating current voltage of the electric machine 14 into a high direct current voltage of the on-board power system 2. It is therefore also possible that the electric power storage device 10 and the electric machine 14 can exchange electric power via the on-board power system 2, depending on the operating mode of the electric machine 14.

In addition, the first converter 4 of the on-board power system 2 is configured as a component of a charging device 16 of the on-board power system 2. Other components of the on-board power system 2 include a first charge connection 18 and a second charge connection 20. The first charge connection 18 is configured herein as a charging socket, particularly an AC charging socket. The second charge connection 20 is configured herein as a charging socket, particularly a DC charging socket.

FIG. 1a further shows a first charging station 22, herein an AC charging station, and a second charging station 24, herein a DC charging station, which are both arranged outside the motor vehicle. Regardless of the embodiment of the method presented here, the on-board power system 2 is connected via at least one of the charge connections 18, 20 to at least one charging socket 22, 24 for charging the electric power storage device 10. Electric power is fed from the respective charging station 22, 24 via the charge connection 18, 20 by means of a respective current, i.e. direct current or alternating current, at a defined charging power into the on-board power system 2, wherein alternating current from the first charging station 22 is converted into direct current using the first converter 4 of the charging device 16. The charging power must also be set for a charging process when the motor vehicle is in operation, wherein in this case the on-board power system 2 stores the electric power in the power storage device 10. After charging the power storage device 10 when the motor vehicle is in operation, electric power is provided to the consumer 12 and the electric machine 14 from the power storage device 10.

The first embodiment of the system according to the invention comprises an adapter 26 and a discharging station 28 as components. This adapter 26 comprises a discharge connection 30, in this case an insertable discharging socket, and at least one intermediate connection 32, in this case an intermediate plug. At least one other component of the system according to the invention is configured as an intermediate connection 34, in this case as an intermediate socket, of the on-board power system 2. Furthermore, a discharging station 28 is provided as a component of the system according to the invention. The discharge connection 30 is configured as a high-voltage discharge connection or high-voltage tap. Furthermore, the two intermediate connections 32, 34 are configured as high-voltage intermediate connections or high-voltage taps. The discharge connection 30 may further be configured as a direct voltage tap (DC tap).

Various tests must be performed on the motor vehicle during and/or after the production of the motor vehicle before it leaves the production site. These also include a test of a charging process of the on-board power system 2 of the motor vehicle and thus of the motor vehicle as a whole. As explained above, the on-board power system 2 is connected via the at least one charge connection 18, 20 to the at least one charging station 22, 24 for performing a charging process, in this case the charging process to be tested, but also for each other charging process during the operation of the motor vehicle.

The adapter 26 must be connected to the on-board power system 2 via the intermediate connections 32, 34 which are adapted for high voltage to perform the embodiment of the method according to the invention, i.e. for testing the charging process. The adapter 26 is further connected to the discharging station 28 via the discharge connection 30, which is adapted for high voltage. For testing the charging process, electric power from the at least one charging station 22, 24 is fed into the on-board power system 2 at the same charging power that is also set for operating the vehicle. The voltage of the electric power has a first high value here. Furthermore, a primary portion of the electric power having the high voltage value is fed or transferred through the on-board power system 2 and from the on-board power system 2 into the adapter 26 and from the adapter 26 into the discharging station 28. Feeding electric power from the at least one charging station 22, 24 into the electric power storage device 10 is avoided in this process. For a secondary portion of the electric power fed in, a value of the voltage of this secondary portion is converted to a second low voltage value by the second converter 6 and provided to the consumer 12, wherein the consumer 12 as a control device is configured to test the charging process using the secondary portion of the electric power provided. The charging process is thus preformed and tested for the motor vehicle, since the electric power is conducted through the on-board power system 2 at the defined charging power.

FIG. 1b shows the adapter 26 and some cables of the on-board power system 2 and the intermediate connection 34, which is connected to the intermediate connection 32 of the adapter 26 to perform the method. FIG. 1b shows another consumer 36, in this case a high-voltage consumer or a respective load, which is connected to the on-board power system 2. When the method is performed, electric power for testing the charging process is not fed into the power storage device 10. The electric power can also be conducted past the consumer, e.g. a regular high-voltage consumer. Alternatively the electric power can be supplied to the consumer 36, which for example is configured as a high-voltage consumer, wherein in this case as well no electric power is fed into the power storage device 10. In both cases, at least the primary portion of the electric power, which is supplied via the charge connection 18 or 20, which is configured as a charging socket, to the on-board power system 2, which is configured as a high-voltage on-board power system, is removed from the on-board power system 2 again via the adapter 26 and optionally in part via a consumer, particularly a high-voltage consumer 36.

In previous procedures for testing an on-board power system, a respective power storage device of an on-board power system of a vehicle was also supplied with electric power at the defined charging power and therefore charged. As a result, however, the power storage device was fully charged with electric power after the charging process to be tested. It was necessary to empty the electric power storage device to be able to perform another charging process. The previous practice was to drive the motor vehicle until its electric power storage device was empty, and only then could the new charging process be performed and tested.

But in the embodiment of the method according to the invention, the power storage device 10 is not charged, which is why using this method makes it possible to perform and test another second charging process after the first charging process to be tested is completed, since the power storage device 10 is empty or at least almost empty after the first charging process.

Figure 2:
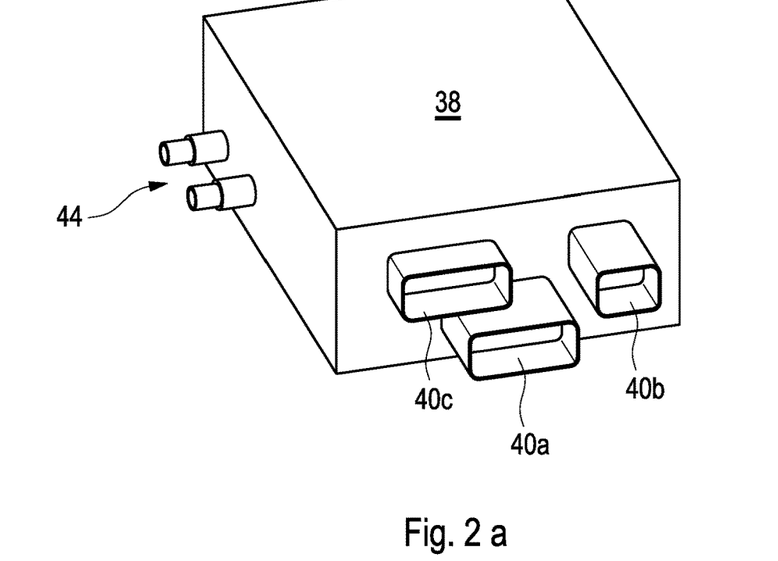
FIGS. 2a and 2b are schematic views of an adapter of a second embodiment of the system according to the invention for performing a second embodiment of the method according to the invention.

FIG. 2a shows a second embodiment of an adapter 38 of the second embodiment of the system according to the invention. This adapter 38 comprises multiple discharge connections 40a, 40b, 40c configured as discharging sockets, two of which are also shown in FIG. 2b. For performing a second embodiment of the method according to the invention, at least one of these discharge connections 40a, 40b, 40c is connected to a respective port connection 42a, 42b of a discharging station of the second embodiment of the system, which is not shown in detail herein. The discharge connections 40a, 40b, 40c and the port connections 42a, 42b are configured as 2-pole or 3-pole discharging sockets and 2-pole or 3-pole discharging plugs, respectively. Furthermore, the adapter 38 comprises at least one intermediate connection 44, via which the adapter 38 is connected to an on-board power system of a motor vehicle to perform the embodiment of the method. Like in the first embodiment of the method, electric power from at least one charging station is conducted via at least one charge connection of the on-board power system at a defined charging power into the on-board power system and conducted from the on-board power system via the at least one intermediate connection 44, the adapter 38, and at least one discharge connection 40a, 40b, 40c to a discharging station, while no electric power is fed into the electric power storage device and thus stored.

The invention claimed is:

1. A method for testing a charging process of an electrically powered motor vehicle having an on-board power system, comprising:
provision of the on-board power system with at least one charge connection for connecting the on-board power system to a charging station, wherein the on-board power system is also connected to at least one electric power storage device of the electrically powered motor vehicle,
connecting an adapter having at least one discharge connection to the on-board power system, separate from the at least one charge connection, in a manner which circumvents the at least one charge connection,
testing the charging process by conducting electric power via the at least one charge connection into the on-board power system,
wherein a primary portion of the electric power conducted into the on-board power system through the at least one charge connection is simultaneously conducted off-board the electrically powered motor vehicle in a discharge process via the at least one discharge connection of the adapter, wherein the at least one electric power storage device is neither charged nor discharged during testing of the charging process.

2. The method according to claim 1, wherein the electric power is conducted into the on-board power system at a defined rate.

3. The method according to claim 2, wherein the electric power is conducted into the on-board power system via the charging station by means of a first high voltage, wherein a secondary portion of the electric power provided for testing the charging process is converted or transformed from the first high voltage to a second low voltage.

4. The method according to claim 2, wherein the on-board power system comprises at least one charging device, which serves as the at least one charge connection, wherein the adapter is connected through the on-board power system to the charging device via a high-voltage tap included in the adapter.

5. The method according to claim 1, wherein the electric power is conducted into the on-board power system via the charging station by means of a first high voltage, wherein a secondary portion of the electric power provided for testing the charging process is converted or transformed from the first high voltage to a second low voltage.

6. The method according to claim 5, wherein the on-board power system is also connected to at least one electrical consumer, wherein the at least one electric power storage device is configured as a high-voltage power storage device and the at least one electrical consumer is configured as a low-voltage consumer, wherein the secondary portion of the electric power conducted into the on-board power system is supplied to the at least one electrical consumer, wherein the primary portion of the electric power bypasses the at least one electric power storage device as the primary portion of the electric power is discharged from the on-board power system via a high-voltage tap and the at least one discharge connection of the adapter.

7. The method according to claim 6, further comprising the provision of at least one control device for controlling an operation of the on-board power system, wherein the secondary portion of the electric power is provided to the at least one control device while testing the charging process, wherein the at least one control device is connected to the on-board power system and configured as the low-voltage consumer.

8. The method according to claim 5, wherein the on-board power system comprises at least one charging device, which serves as the at least one charge connection, wherein the adapter is connected through the on-board power system to the charging device via a high-voltage tap included in the adapter.

9. The method according to claim 1, wherein the on-board power system comprises at least one charging device, which serves as the at least one charge connection, wherein the adapter is connected through the on-board power system to the charging device via a high-voltage tap included in the adapter.

10. The method according to claim 9, wherein the on-board power system is also connected to at least one electrical consumer, wherein the at least one electric power storage device is configured as a high-voltage power storage device and the at least one electrical consumer is configured as a low-voltage consumer, wherein the secondary portion of the electric power conducted into the on-board power system is supplied to the at least one electrical consumer, wherein the primary portion of the electric power bypasses the at least one electric power storage device as the primary portion of the electric power is discharged from the on-board power system via a high-voltage tap and the at least one discharge connection of the adapter.

11. A system for testing a charging process of an electrically powered motor vehicle having an on-board power system, comprising:

at least one charge connection for connecting the on-board power system to a charging station, at least one electric power storage device of the electrically powered motor vehicle which is connected to the on-board power system, and an adapter having at least one discharge connection, the adapter is connected to the on-board power system, for testing the charging process, separate from the at least one charge connection in a manner which circumvents the at least one charge connection, wherein, during a testing of the charging process, a primary portion of electric power conducted into the on-board power system through the at least one charge connection is simultaneously conducted off-board the electrically powered vehicle in a discharge process via the at least one discharge connection of the adapter, and wherein, during the testing of the charging process, the at least one electric power storage device is neither charged nor discharged.

12. The system according to claim 11, wherein the at least one discharge connection of the adapter is configured as a direct current discharge connection and/or as an alternating current discharge connection.

13. The system according to claim 12, wherein the adapter comprises at least one high-voltage tap for connecting to the on-board power system.

14. The system according to claim 12, further comprising at least one discharging station which must be connected to the at least one discharge connection and is configured to receive electric power to be discharged from the on-board power system.

15. The system according to claim 12, wherein the adapter is connectable to the on-board power system prior to testing the charging process so that the primary portion of the electric power conducted into the on-board power system while testing the charging process bypasses the at least one power storage device and is subsequently discharged from the on-board power system through the at least one discharge connection of the adapter.

16. The system according to claim 11, wherein the adapter comprises at least one high-voltage tap for connecting to the on-board power system.

17. The system according to claim 16, further comprising at least one discharging station which must be connected to the at least one discharge connection and is configured to receive electric power to be discharged from the on-board power system.

18. The system according to claim 16, wherein the adapter is connectable to the on-board power system prior to testing the charging process so that the primary portion of the electric power conducted into the on-board power system while testing the charging process bypasses the at least one power storage device and is subsequently discharged from the on-board power system through the at least one discharge connection of the adapter.

19. The system according to claim 11, further comprising at least one discharging station which must be connected to the at least one discharge connection and is configured to receive electric power to be discharged from the on-board power system.

20. The system according to claim 11, wherein the adapter is connectable to the on-board power system prior to testing the charging process so that the primary portion of the electric power conducted into the on-board power system while testing the charging process bypasses the at least one power storage device and is subsequently discharged from the on-board power system through the at least one discharge connection of the adapter.

\* \* \* \* \*